US012812847B2

(12) United States Patent
Fornara

(10) Patent No.: US 12,812,847 B2
(45) Date of Patent: Nov. 24, 2026

(54) ONE-TIME PROGRAMMABLE MEMORY CELL AND METHOD FOR MANAGING THE LOGIC STATE OF THE MEMORY CELL

(71) Applicant: STMicroelectronics International N.V., Geneva (CH)

(72) Inventor: Pascal Fornara, Pourrieres (FR)

(73) Assignee: STMicroelectronic International N.V., Geneva (CH)

( * ) Notice: Subject to any disclaimer, the term of this patent is extended or adjusted under 35 U.S.C. 154(b) by 349 days.

(21) Appl. No.: 18/586,440

(22) Filed: Feb. 24, 2024

(65) Prior Publication Data

US 2024/0292610 A1 Aug. 29, 2024

(30) Foreign Application Priority Data

Feb. 28, 2023 (FR) ........................................ 2301816

(51) Int. Cl.

*H10B 20/25* (2023.01)
*G11C 17/06* (2006.01)
*G11C 17/18* (2006.01)
*H10B 99/00* (2023.01)

(52) U.S. Cl.

CPC ............. *H10B 20/25* (2023.02); *G11C 17/06* (2013.01); *G11C 17/18* (2013.01); *H10B 99/16* (2023.02)

(58) Field of Classification Search

CPC ........................................................ H10B 20/25

See application file for complete search history.

(56) References Cited

U.S. PATENT DOCUMENTS

| | | | | |
|---|---|---|---|---|
| 2010/0078699 A1* | 4/2010 | Nakano | G11C 17/16 257/E29.345 |
| 2017/0125427 A1* | 5/2017 | Shum | H10B 20/25 |
| 2017/0250187 A1* | 8/2017 | Taniguchi | G11C 17/06 |
| 2018/0061755 A1* | 3/2018 | Yamamoto | H10B 20/25 |
| 2020/0227517 A1 | 7/2020 | Fornara | |
| 2021/0320110 A1 | 10/2021 | Chern | |
| 2022/0189973 A1* | 6/2022 | Horch | G11C 17/165 |

FOREIGN PATENT DOCUMENTS

JP S4839862 U 5/1973

OTHER PUBLICATIONS

INPI Search Report and Written Opinion for priority application, FR Appl. No. 2301816, report dated Sep. 1, 2023, 9 pgs.

* cited by examiner

*Primary Examiner* — Benjamin P Sandvik

(74) *Attorney, Agent, or Firm* — Crowe & Dunlevy LLC

(57) ABSTRACT

A memory cell is formed by a PIN diode having three contacts. A breakdown voltage is applied to break down a gate oxide arranged between a region of the PIN diode and a substrate region. The breakdown or non-breakdown state of the gate oxide is determined by applying a read voltage between the anode and the cathode of the diode and determining the value of the corresponding current flowing in the diode.

20 Claims, 7 Drawing Sheets

ONE-TIME PROGRAMMABLE MEMORY CELL AND METHOD FOR MANAGING THE LOGIC STATE OF THE MEMORY CELL

PRIORITY CLAIM

This application claims the priority benefit of French Application for Patent No. 2301816, filed on Feb. 28, 2023, the content of which is hereby incorporated by reference in its entirety to the maximum extent allowable by law.

TECHNICAL FIELD

Embodiments and implementations of the invention relate to non-volatile "one-time programmable" (OTP) type memory cells.

BACKGROUND

Typically, a one-time programmable memory cell functions as a fuse or antifuse, whose state is changed in an irreversible manner, for example by breakdown of a dielectric through the application of a high programming voltage, or breakdown voltage, to the memory cell, such that the memory cell passes from a non-conductive state to a conductive state, thereby changing its resistance.

For example, a one-time programmable memory cell in the form of an antifuse typically comprises a capacitor which has a dielectric layer between it two electrodes. This capacitor can be formed by an MOS transistor in which the source and drain are connected. Depending on the programming voltage applied and the programming time, a conductive channel can be obtained which completely traverses the dielectric layer of the capacitor, a phenomenon known to the person skilled in the art as a "hard breakdown". The dielectric layer is then said to be (electrically) "broken down".

As a result, this conductive channel definitively changes the state of the capacitor from non-conductive to conductive, i.e., the resistance of the memory cell. The logic value of the memory cell, for example initially equal to "0" then becomes "1" when the created conductive channel completely traverses the dielectric layer of the capacitor.

Typically, an antifuse structure comprises a first MOS transistor with a thin gate oxide, mounted as a capacitor, so as to allow the breakdown of this oxide, as well as a second transistor having a thicker gate oxide for handling the breakdown of the oxide of the first transistor and reading the structure so as to determine its logic state.

However, such an OTP memory cell structure uses two transistors which is detrimental to the silicon footprint.

As a result there is a need to propose a more compact OTP memory cell.

SUMMARY

According to one aspect, an integrated memory device is proposed comprising a one-time programmable memory cell.

This memory cell includes: a first semiconductor bar having a lower face and an upper face opposite the lower face; a first electrically isolating region, for example a thin dielectric layer located between a first zone of the lower face of the bar and a semiconductor region, for example an active substrate zone; and a second electrically isolating region, for example a dielectric layer including a silicon dioxide/silicon nitride/silicon dioxide type stack (known to the person skilled in the art by the acronym ONO), thicker than the first isolating region and located between a second zone of the lower face and said semiconductor region.

The memory cell has a first logic state in the presence of a non-electrically broken down first electrically isolating region and a second logic state in the presence of an electrically broken down first electrically isolating region.

The integrated memory device also comprises: a first circuit configured to apply a breakdown potential difference between the semiconductor region and the semiconductor bar so as to break down the first isolating region, and a second circuit configured to apply a read voltage between two locations of the upper face of the silicon bar and determine the value of the current flowing between the two locations so as to determine the logic state of the memory cell.

The memory cell thus includes for example at least: a first electrically conductive contact, a second electrically conductive contact, and a third electrically conductive contact, the first circuit being configured to apply the breakdown potential difference between the third contact and the first or the second contact, and the first and second circuits being configured to apply the read voltage and determine the value of said current between the first contact and the second contact.

According to one possible variant, the first semiconductor bar may have a single type of conductivity, preferably opposite the conductivity type of the semiconductor region.

The first bar has for example conductivity type P.

Such a bar then forms a resistive element.

The first bar overlaps a portion of the semiconductor region, for example a substrate region to allow the breakdown of the oxide located between this overlapping part and the substrate semiconductor region.

And the same bar is used to determine the logic state of the memory cell.

Therefore, an OTP memory cell is used with a smaller footprint than a memory cell of the prior art with two transistors.

According to another possible variant, the first bar can comprise a Positive Intrinsic Negative (PIN) diode.

A PIN diode is a diode comprising a region of intrinsic polysilicon, i.e., undoped, sandwiched between two respectively doped regions comprising a P-type (anode) region and an N-type (cathode) region.

The first zone of the lower face of the PIN diode includes at least a portion of the lower face of the intrinsic polysilicon region, or the anode region or the cathode region according to the embodiment envisaged.

The first circuit is configured to apply the breakdown potential difference between the semiconductor region and the anode region and/or the cathode region (according to the embodiment envisaged), and the second circuit is configured to apply the read voltage between a location of the upper face of the anode region and a location of the upper face of the cathode region.

Thus, the bar including the PIN diode overlaps a portion of the semiconductor region, for example a substrate region to allow the breakdown of the oxide between this overlapping portion and the semiconductor region of the substrate.

And, also, the same bar is used to determine the logic state of the memory cell.

Therefore, a reduced footprint is also obtained.

Furthermore, the use of a PIN diode is more advantageous than the use of a resistive bar, as mentioned above.

Indeed, the PIN diode is read directly and delivers a first forward current when the first isolating region is not broken down, corresponding to a first logic state of the memory cell.

The PIN diode delivers a second forward current when the first isolating region is broken down, corresponding to a second logic state. And this second forward current is much lower, for example by 5 decades, than the first forward current because the PIN diode is no longer operational.

The use of a PIN diode therefore makes it possible to easily distinguish between the two logic states of the memory cell.

Several embodiments of this other variant using a PIN diode are possible.

Thus according to one embodiment, the semiconductor region comprises a substrate semiconductor region, the first zone of the lower face of the PIN diode includes at least a portion of the lower face of the anode region and the second zone of the lower face of the PIN diode is located adjacent to the first zone and comprises the rest of the lower face of the PIN diode, the first isolating region comprises an isolating layer, for example a film of silicon dioxide, and the second isolating region comprises a shallow trench isolation (STI) extending adjacent to this isolating layer under the second zone of the lower face of the PIN diode.

Thus, in this embodiment it is the anode region which overlaps the substrate semiconductor region.

According to another possible embodiment, the semiconductor region comprises a substrate semiconductor region, the first zone of the lower face of the PIN diode includes at least one portion of the lower face of the cathode region and the second zone of the lower face of the PIN diode is located next to the first zone and comprises the rest of the lower face of the PIN diode, the first isolating region comprises an isolating layer, and the second isolating region comprises a shallow isolating trench extending adjacent to this isolating layer under the second zone of the lower face of the PIN diode.

In this embodiment, it is the cathode region which overlaps the substrate semiconductor region.

However, the inventor has observed that it was more efficient at distinguishing in the readout the first forward current (non-broken down oxide) from the second forward current (broken down oxide) than anode region which overlaps the substrate region.

In any embodiment, the substrate semiconductor region preferably has a conductivity type opposite to the conductivity type of the anode region.

According to another possible embodiment, the semiconductor region comprises a second semiconductor bar located between the lower face of the PIN diode and a third electrically isolating region, the first zone of the lower face of the PIN diode includes at least one portion of the lower face of the intrinsic polysilicon region and the second zone of the lower face of the PIN diode is located on either side of the first zone, the first isolating region includes a first isolating layer and the second isolating region includes a second isolating layer thicker than the first isolating layer.

Thus, in this embodiment, the oxide to be broken down is located between the intrinsic semiconductor region and the second semiconductor bar on which the PIN diode rests.

The third isolating region includes, for example, a shallow isolating trench.

The second bar preferably has a conductivity type opposite to that of the anode region.

According to a further possible embodiment of this other variant, compatible with the manufacture of non-volatile memory cells with floating gates and selection transistors buried in the substrate, the first zone of the lower face of the PIN diode includes at least a portion of the lower face of the intrinsic polysilicon region and the second zone of the lower face of the PIN diode is located on either side of the first zone, the first isolating region includes a first isolating layer, for example a layer of silicon dioxide and the second isolating region includes a second isolating layer, for example a silicon dioxide/silicon nitride/silicon dioxide stack, thicker than the first isolating layer, and the semiconductor region includes a semiconductor trench in contact with the first isolating layer and extending through a fourth isolating region, for example including a shallow trench.

The semiconductor trench preferably has a conductivity type opposite the conductivity type of the anode region.

According to another aspect a method is proposed for managing the logic state of a one-time programmable memory cell, the memory cell including a first semiconductor bar having a lower face and an upper face opposite the lower face, a first electrically isolating region located between a first zone of the lower face and a semiconductor region, a second electrically isolating region thicker than the first isolating region located between a second zone of the lower face and said semiconductor region, a method in which the memory cell is given a first logic state in the presence of a first non-electrically broken down isolating region and a second logic state in the presence of a first electrically broken down isolating region, and the first isolating region is broken down by applying a breakdown potential difference between the semiconductor region and the semiconductor bar.

According to another aspect, a method is proposed for managing the logic state of a one-time programmable integrated memory cell, the memory cell including a first semiconductor bar having a lower face and an upper face opposite the lower face, a first electrically isolating region located between a first zone of the lower face and a semiconductor region, a second electrically isolating region thicker than the first isolating region located between a second zone of the lower face and said semiconductor region, a method in which the memory cell is given a first logic state in the presence of a first non-electrically broken down isolating region and a second logic state in the presence of a first electrically broken down isolating region, and the logic state of the memory cell is determined by applying a read voltage between two locations of the upper face of the silicon bar and determining the value of the current flowing between the two locations.

According to one embodiment, in which the first bar comprises a PIN diode including an intrinsic polysilicon region between an anode region and a cathode region, the first zone of the lower face of the PIN diode including at least one portion of the lower face of the intrinsic polysilicon region, or of the anode region and/or of the cathode region, the breakdown potential difference is applied between the semiconductor region and the anode region and/or the cathode region, and the read voltage is applied between a location of the upper face of the anode region and a location of the upper face of the cathode region.

BRIEF DESCRIPTION OF THE DRAWINGS

Other advantages and features of the invention will appear upon examining the detailed description of non-limiting embodiments and implementations, and from the appended drawings, wherein.

DETAILED DESCRIPTION

Figure 1:
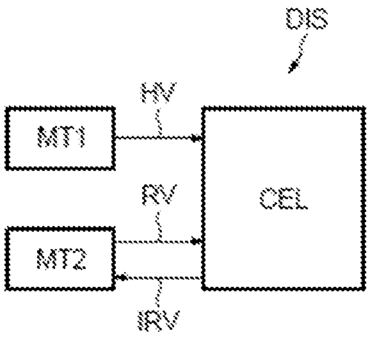
FIG. 1 shows an integrated memory device comprising here a one-time programmable memory cell.

In FIG. 1, the reference DIS refers to an integrated memory device comprising here a one-time programmable memory cell CEL (referred to as an "OTP" cell).

As discussed in more detail below, this memory cell CEL includes a first electrically isolating region intended to be broken down or not, the memory cell CEL having a first logic state in the presence of a non-broken down first isolating region and a second logic state in the presence of a broken down first isolating region.

The memory device DIS also includes a first circuit MT1 with a standard and known structure, configured for applying a breakdown potential difference HV to the cell CEL so as to breakdown this first isolating region in order to confer the second logic state to the cell CEL.

The device DIS also includes a second circuit MT2, also with a standard and known structure, configured for applying a read voltage RV between two locations of the memory cell so as to determine the value of the current IRV flowing between these two locations and thus determine the logic state of the memory cell.

Figure 2:
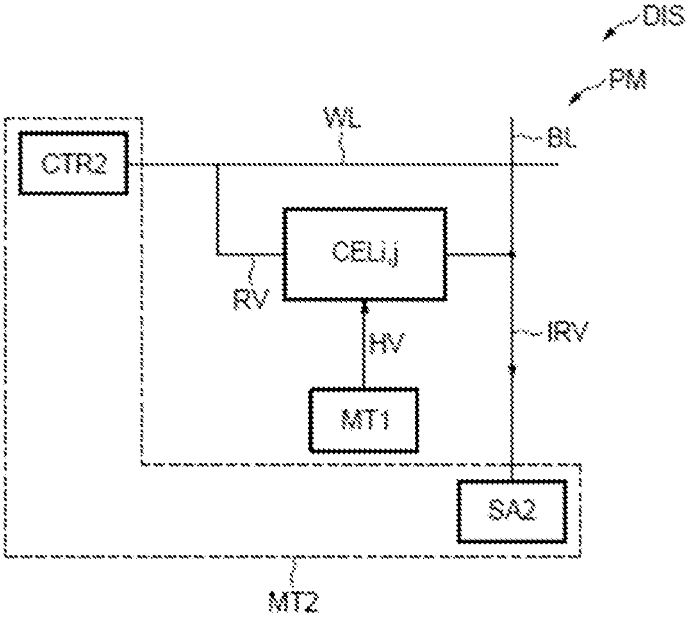
FIG. 2 shows a memory device including a memory plan with a matrix of memory cells arranged in rows and columns.

As illustrated in FIG. 2, the memory device DIS can include a memory plan PM including a matrix of memory cells CELi,j arranged in rows and columns.

Thus, each memory cell CELi,j is connected to a word line WL for receiving the read voltage RV.

The memory cell CELi,j is also connected to a bit line BL on which the reading current IRV will flow.

The second circuit MT2 therefore includes a circuit CTR2 connected to the word line WL, with a standard and known structure, and intended to deliver the read voltage RV.

Furthermore, the second circuit MT2 includes, for example, a sense amplifier SA2 with a standard and known structure for determining the value of the reading current IRV.

Reference is now made more particularly to FIGS. 3 to 10 for describing several embodiments of a first variant.

Figure 10:
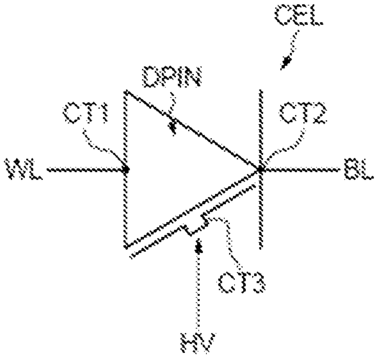
FIG. 10 is a schematic circuit diagram of the memory cell.

In this first variant, the memory cell CEL includes a PIN diode, referenced DPIN, illustrated schematically in FIG. 10.

More particularly, this PIN diode DPIN is a diode with three contacts.

A first contact CT1, connected to the anode region, is connected to the word line WL.

A second contact CT2, connected to the cathode region, is connected to the bit line BL while a third contact CT3 is intended to receive the breakdown voltage HV.

Figure 3:
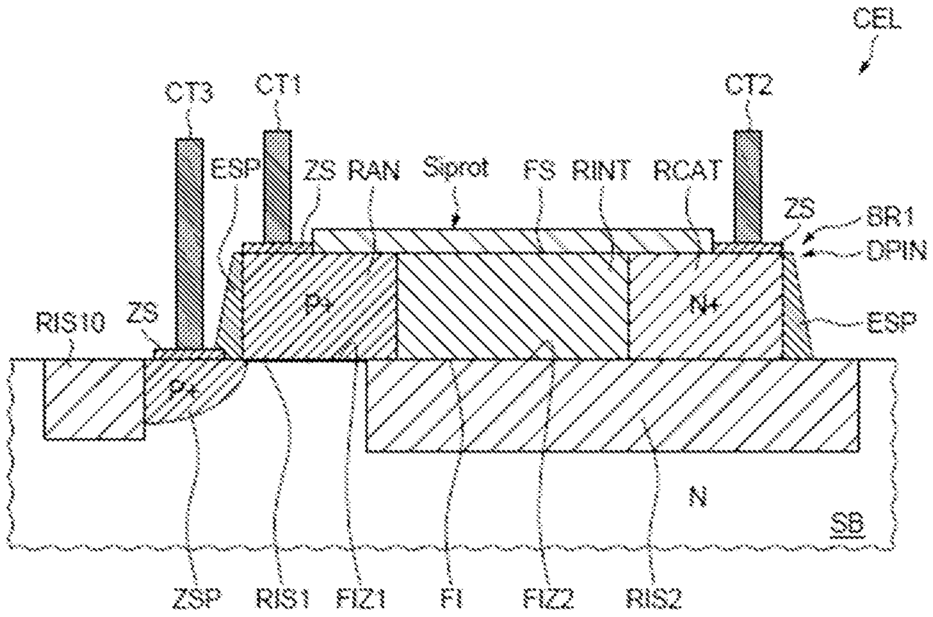
FIG. 3 shows the one-time programmable memory cell including a first semiconductor bar.

Now with more particular reference to FIG. 3, it is shown that the one-time programmable memory cell CEL includes a first semiconductor bar BR1, for example made of silicon, having a lower face FI and an upper face FS opposite the lower face.

This first bar comprises here the PIN diode DPIN including an intrinsic polysilicon region RINT between the anode region RAN and the cathode region RCAT.

The intrinsic polysilicon region RINT has, for example, a dopant concentration of less than $10^{15}$ atoms/cm$^3$.

The P+ doped anode region RAN has, for example, a dopant concentration of in the order of $10^{20}$ atoms/cm$^3$.

The N+ doped cathode region has, for example, a dopant concentration of in the order of $10^{20}$ atoms/cm$^3$.

The lower face FI of the first bar includes a first zone FIZ1 including at least a portion of the lower face of the anode region RAN.

A first isolating region RIS1, formed here by a thin layer of silicon dioxide having, for example, a thickness in the order of twenty angstroms, is located between the first zone FIZ1 and a substrate semiconductor region SB having, for example, N-type conductivity.

This substrate semiconductor region can be the substrate itself or an N-doped well in a P-type substrate.

The memory cell CEL also includes a second electrically isolating region RIS2, here a shallow trench known by the person skilled in the art as a Shallow Trench Isolation (STI) located between a second zone FIZ2 of the lower face FI of the PIN diode and the substrate semiconductor region SB.

This second zone FIZ2 of the lower face of the PIN diode is located adjacent to the first zone FIZ1 and comprises the rest of the lower face of the PIN diode.

The shallow isolating trench RIS2 extends adjacent to the first isolating region RIS1.

The first bar BR1 also includes isolating spacers ESP on its sides which have a standard and known structure.

The upper face FS of the first bar has, above the anode region RAN, a metal silicide layer ZS, for example made of $CoSi_2$, as well as the first electrically conductive contact CT1, for example made of copper or tungsten, coming into contact with the siliconized zone ZS.

Likewise, the upper face FS of the first bar also includes above the cathode region a metal silicide zone ZS, for example also made of $CoSi_2$, as well as the second electrically conductive contact CT2 contacting this siliconized zone ZS.

The rest of the upper face FS of the first bar is covered with a protective layer denoted Siprot (silicidation protection layer) which is intended during the manufacture of the memory cell to protect the underlying part of the upper face of the bar from siliconization.

This protective layer includes, for example, silicon dioxide or a stack of a layer of silicon dioxide covered with silicon nitride.

The cell CEL also includes within the substrate region SB, a doped zone ZSP, having P-type conductivity and, for example, a dopant concentration of in the order of $10^{20}$ atoms/cm$^3$, covered by a metal silicide zone ZS, as well as the third electrically conductive contact CT3 contacting this siliconized zone ZS.

It is also possible to provide, adjacent to this doped zone ZSP, an isolating region RIS 10, for example of the shallow trench type, so as to electrically isolate it from other components of the integrated circuit.

As shown in more detail in the following, the high breakdown voltage HV will be applied between the first contact CT1 and the third contact CT3, for example by applying the voltage HV to one of these two contacts and the ground to the other.

On the other hand, the read voltage RV will be applied between the two contacts CT1 and CT2, for example by applying the voltage RV to the first contact CT1 and the ground to the second contact CT2 so as to forward bias the diode DPIN and read the corresponding current IRV.

Figure 4:
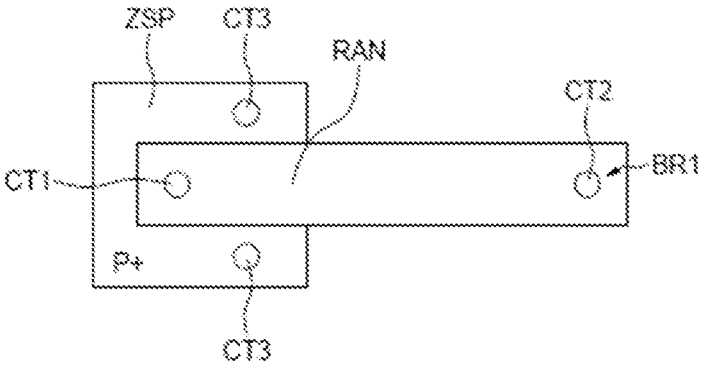
FIG. 4 illustrates contact placement.

Of course, it would be possible to place third contact CT3 in another location. It would thus be possible for example, as illustrated in FIG. 4, to place two third contacts CT3 on either side of the anode region RAN.

Figure 5:
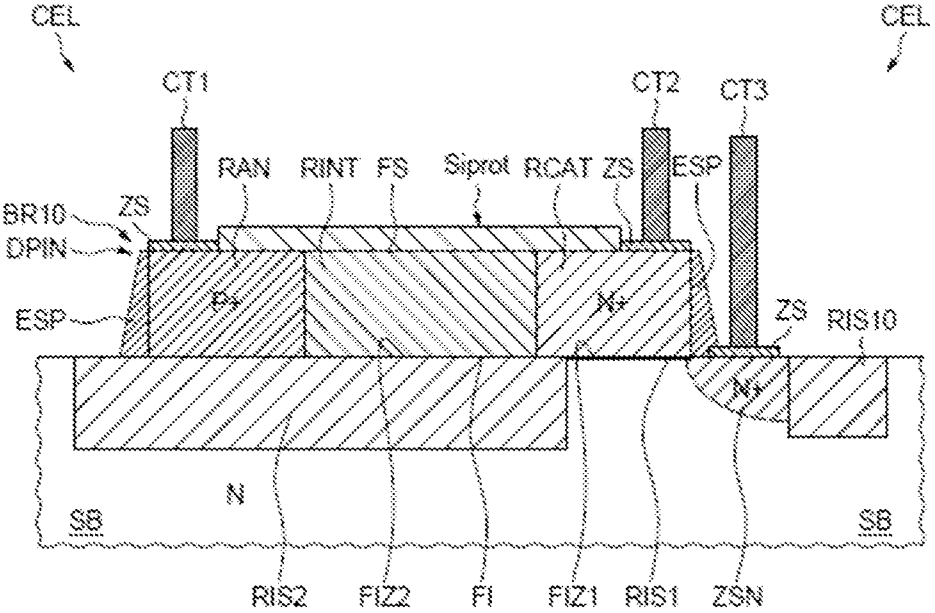
FIG. 5 shows an embodiment of a memory cell using a PIN diode.

Reference will now be made more particularly to FIG. 5 to describe another embodiment of a memory cell CEL also using a PIN diode DPIN.

Only the differences from the embodiment shown in FIG. 3 will now be described.

The memory cell CEL of FIG. 5 also includes a first semiconductor bar BR10, for example of silicon, incorporating the PIN diode DPIN including the anode region RAN, the intrinsic polysilicon region RINT and the cathode region RCAT.

One difference from the cell CEL in FIG. 3 is the location of the first isolating region RIS1.

Indeed, in FIG. 5, the first zone FIZ1 of the lower face of the PIN diode DPIN includes a portion of the lower face of the cathode region RCAT and the second zone FIZ2 of the lower face of the PIN diode is located adjacent to the first zone FIZ1 and comprises the rest of the lower face of the PIN diode DPIN.

Thus, in this embodiment, the first isolating region RIS1 (thin layer of silicon dioxide) is located between the cathode region and the substrate region SB whereas the second isolating region RIS2 (for example of the shallow trench type) is located between the rest of the PIN diode and the substrate region SB.

Furthermore, here the substrate region SB includes a heavily doped N+ region ZSN with for example a dopant concentration of in the order of $10^{20}$ atoms/$cm^3$, and the third contact CT3 contacts this doped region ZSN via the metal silicide zone ZS.

Another isolating region RIS10 is located adjacent to the highly doped zone ZSN to possibly isolate this zone ZSN from other components.

In this embodiment, the high breakdown voltage HV is applied between the second contact CT2 and the third contact CT3.

The read voltage RV is always applied between the first contact CT1 and the second contact CT2.

Figure 11A:
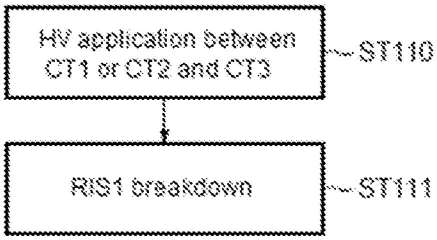
FIG. 11A illustrates steps of a method for break down of an isolating zone.
Figure 11B:
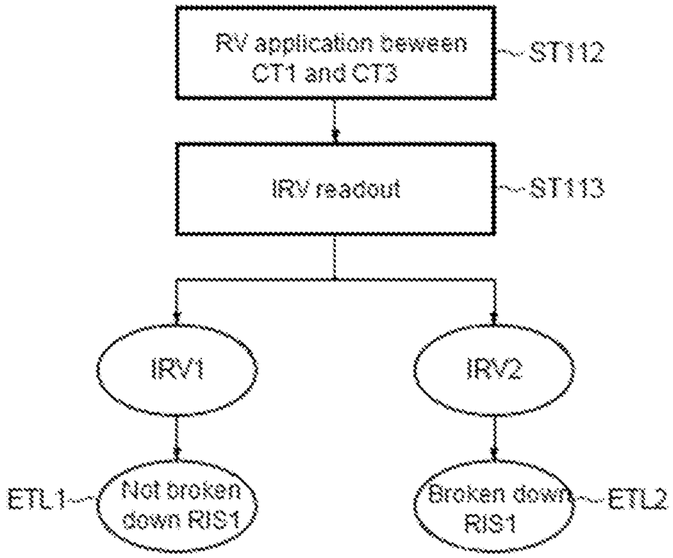
FIG. 11B illustrates steps of a method for determining the logic state of the memory cell.

This is illustrated more particularly in FIGS. 11A and 11B.

Thus, as illustrated in FIG. 11A, in order to break down the first isolating zone RIS1 (the thin layer of the gate oxide type) the first circuit MT1 applies the breakdown voltage HV, for example of in the order of 7.5 volts for a period of in the order of 100 microseconds, either between the first contact CT1 and the third contact CT3, or between the second contact CT2 and the third contact CT3. For example, the voltage HV may be applied to either of the contacts CT1 and CT2 and the ground to the third contact CT3 (step ST110).

This results in the breakdown of the first isolating region RIS1 in step ST111.

As a result, the DPIN diode is no longer operational.

The determination of the logic state of the memory cell CEL is illustrated more particularly in FIG. 11B.

Thus, the seconds circuit MT2 apply the read voltage RV in step ST112 between the first contact CT1 and the first contact CT2 so as to read the diode directly.

This read voltage can be in the order of 1 volt.

In step ST113, the sense amplifier SA2 determines the value of the current IRV resulting from the application of the read voltage RV.

Then two possible values are obtained of current IRV1 and IRV2, the value of current IRV1 being greater than the value of current IRV2.

If the current IRV1 is detected, this circuit that the memory cell CEL has the first logic state ETL1 corresponding to the first isolating region RIS1 (gate oxide) which is not broken down.

On the other hand, if current IRV2 is detected, then this corresponds to a second logic state ETL2 of the memory cell CEL corresponding to the first broken down isolating region RIS1.

Figure 6:
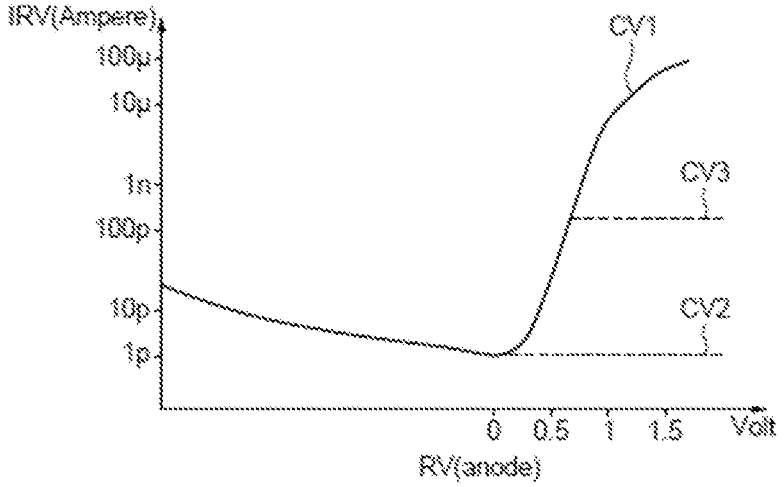
FIG. 6 illustrates the evolution of read current as a function of read voltage.

Now with particular reference to FIG. 6, which illustrates the evolution of the read current IRV as a function of the read voltage RV applied to the anode of the PIN diode, it can be seen that the current IRV follows curve CV1 when the PIN diode is operational, i.e., with a non-broken down gate oxide RIS1.

More precisely, curve CV1, which corresponds to the evolution of current IRV1, decreases from an initial value of more than 10 picoamperes until it reaches a value of in the order of 1 picoampere then, when the diode becomes conductive, the current IRV1 increases abruptly to reach a value of in the order of 10 microamperes around a read voltage RV of in the order of 1 volt.

On the other hand, if the gate oxide RIS1 is broken down, then the diode is no longer operational and the current IRV2 follows curve CV2 in the case of the embodiment of FIG. 3 or curve CV3 in the case of the embodiment of FIG. 5.

Thus, it can be seen that there is a significant difference between the value of current IRV1 and the value of current IRV2 which allows for an easy selection between the two logic states.

It can also be seen that locating the gate oxide RIS1 under the anode region is more effective than locating the gate oxide RIS1 under the cathode region, because in the first location the difference between the IRV1 and IRV2 values is greater than in the second location.

Figure 7:
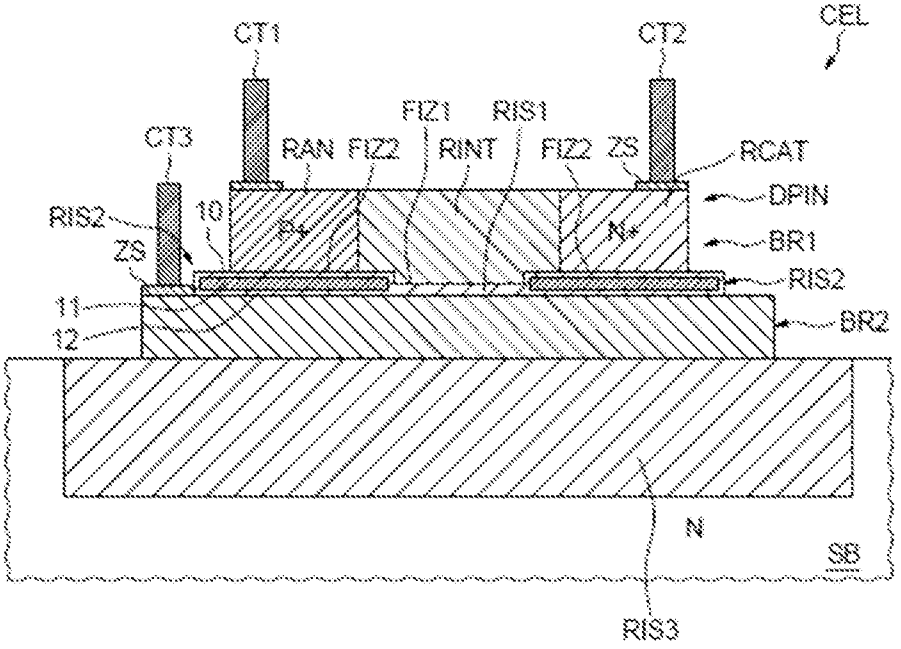
FIG. 7 shows an embodiment of the memory cell using a semiconductor bar including a PIN diode.

Reference is now be made in particular to FIG. 7 in order to illustrate another embodiment of the memory cell CEL, also using a BR1 bar, for example made of silicon, including a PIN diode DPIN.

Again, only the differences between FIG. 7 and FIG. 3 will now be described.

In contrast to the embodiment of FIG. 3, the PIN diode DPIN rests here via the isolating regions RIS1 and RIS2 on a second semiconductor bar BR2, for example made of silicon of N-type conductivity, this second bar resting in turn on a third isolating region RIS3, for example of the shallow trench type, arranged within a substrate SB of N-type conductivity.

The first zone FIZ1 of the lower face of the PIN diode this time includes a portion of the lower face of the intrinsic polysilicon region RINT and the second zone FIZ2 of the lower face of the PIN diode is located on either side of the first zone FIS1.

The first isolating region RIS1 includes a first isolating layer of the gate oxide type, while the second isolating region RIS2 includes a second isolating layer thicker than the first isolating layer, and formed here by a silicon dioxide 10, silicon nitride 11 and silicon dioxide 12 stack.

The third contact CT3 is connected to an edge of the second bar BR2 via a siliconized zone ZS.

The implementation of the possible breakdown of the RIS1 zone as well as the determination of the logic state of the memory cell CEL, described with reference to FIGS. 11A and 11B, also apply to this embodiment of FIG. 7.

Figure 8:
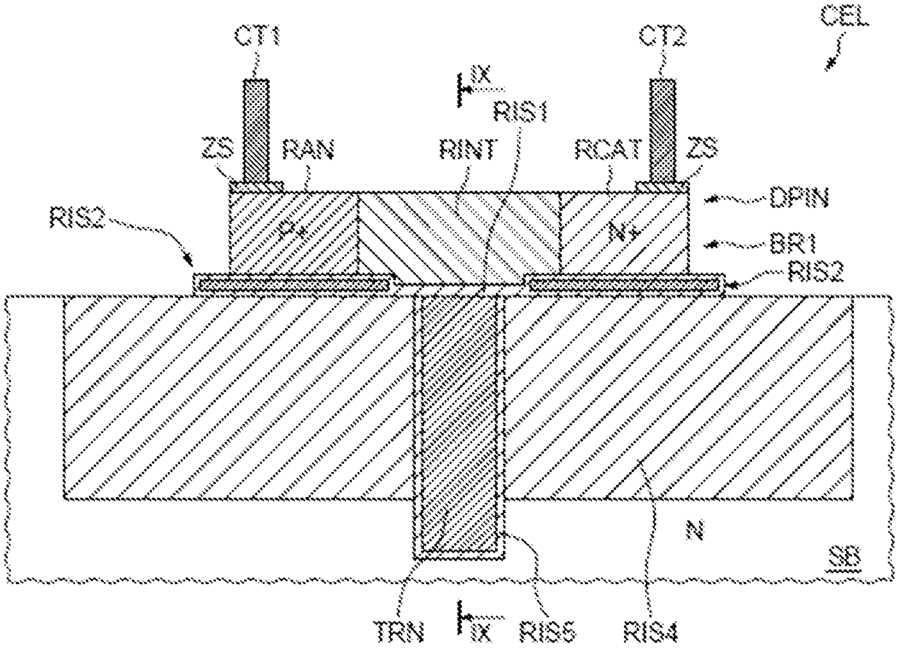
FIGS. 8 and 9 show cross-sectional views of an embodiment of the memory cell using a PIN diode.
Figure 9:
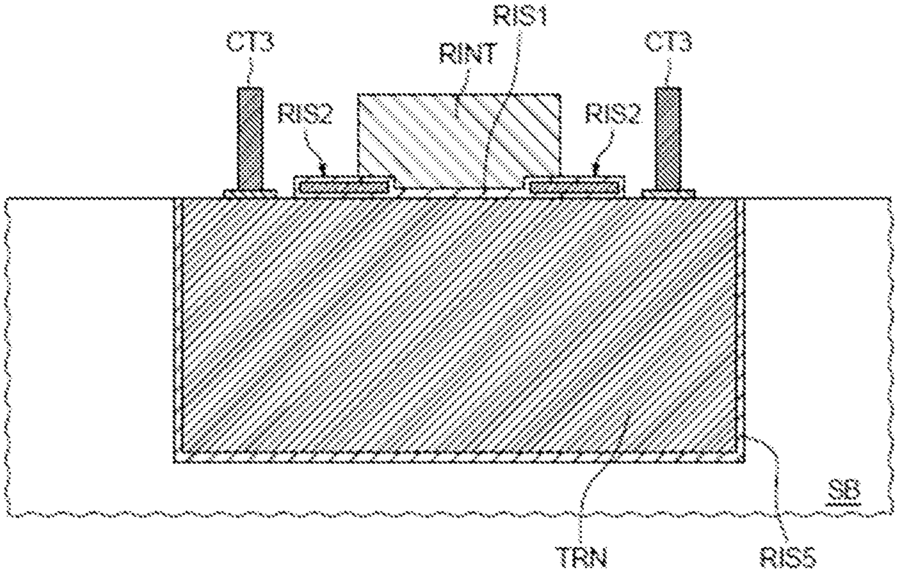

FIG. 8 and FIG. 9, where FIG. 9 is a cross-sectional view along line IX-IX of FIG. 8, illustrate a further embodiment of the memory cell CEL using a PIN diode DPIN.

Compared to the embodiment of FIG. 7, the semiconductor region to which the third contact CT3 is connected is this time no longer the second bar BR2 of FIG. 7 but a semiconductor trench TRN extending under the first isolating region RIS1 through a fourth isolating trench RIS4, for example a shallow trench isolation type (STI).

This semiconductor trench TRN, for example made of highly doped N-type silicon with, for example, a dopant concentration of in the order of $10^{20}$ atoms/$cm^3$, is also isolated from the underlying substrate SB by an electrically isolating casing RIS5.

In this embodiment, although only one third contact CT3 could have been provided, as shown in FIG. 9, two contacts can be provided located on either side of the intrinsic semiconductor region RINT of the PIN diode.

It should be noted that in FIGS. 7 to 9, the Siprot region and the ESP spacers have not been shown for the purpose of simplifying these figures, but of course this region and these spacers are present on the BR1 bar in a similar way to their presence on the BR1 bar of FIG. 3.

Figure 12:
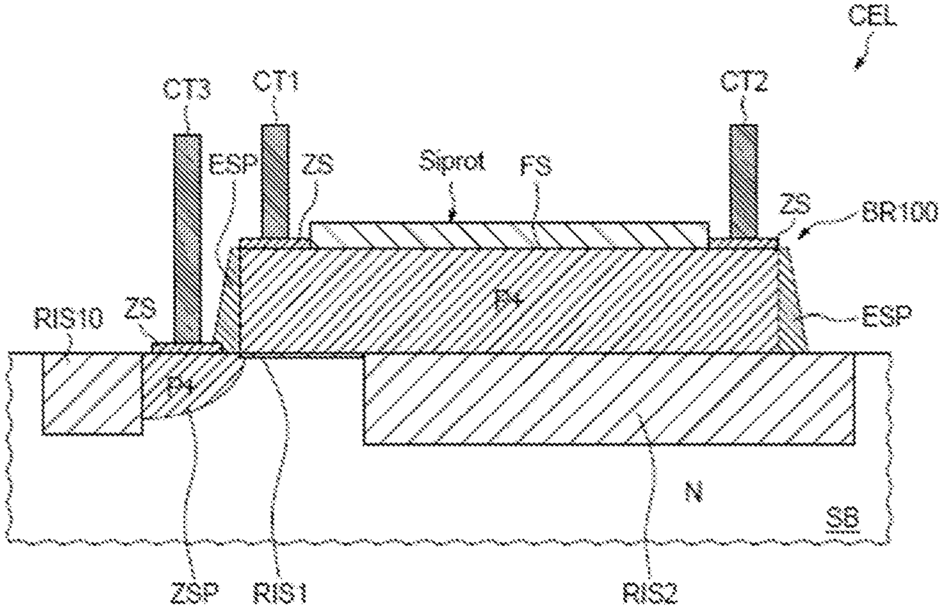
FIG. 12 illustrates another embodiment of a memory cell.

Reference is now made more particularly to FIG. 12 to illustrate another embodiment of a memory cell CEL.

In this embodiment, a three contact PIN diode is no longer used, but a first semiconductor bar BR100, for example made of silicon, having a uniform conductivity type, for example a P+ type conductivity with a dopant concentration of in the order of $10^{20}$ atoms/$cm^3$.

Apart from this difference, the structure of the cell CEL of FIG. 12 is similar to that of FIG. 3.

The breakdown of the first isolating region RIS1 is performed by applying, for example, high voltage HV between the first contact CT1 and the third contact CT3 and the reading of the current IRV is carried out after applying the read voltage RV between the contacts CT1 and CT2.

The bar BR100 is a resistive bar.

The embodiment of FIG. 12 is certainly simpler to implement than the embodiments using a PIN diode.

If the first region RIS1 is not broken down, the resistance between the two contacts CT1 and CT2 has a first resistive value.

However, if the first isolating region RIS1 is broken down, the resistance between the two contacts CT1 and CT2 has a value greater than the resistive value of the BR100 bar.

As a result, if the first isolating region RIS1 is not broken down, the value of the IRV current will be higher than that of the IRV current in the presence of a broken down region RIS1.

This being the case, the difference between these two values is smaller than when using a PIN diode.

Thus, this embodiment is less effective in terms of selecting the logic state of the memory cell CEL than embodiment using a PIN diode.

The invention is not limited to the embodiments and implementations described above.

Figure 13:
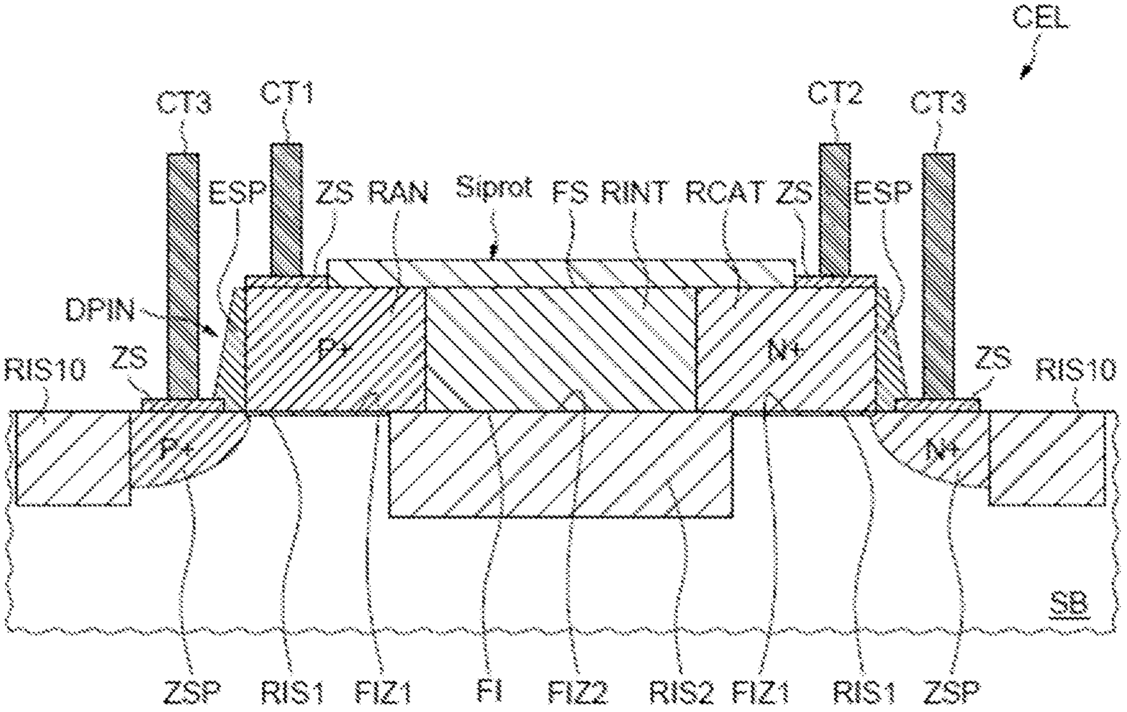
FIG. 13 illustrates a combination of the embodiments of FIGS. 3 and 5.

Thus, it is possible, as illustrated in FIG. 13, to combine the embodiments of FIGS. 3 and 5.

More precisely, the semiconductor region comprises a substrate semiconductor region SB and the first zone FIZ1 of the lower face of the PIN diode DPIN includes at least a portion of the lower face of the anode region RAN and at least a portion of the lower face of the cathode region RCAT.

The second zone FIZ2 of the lower face of the PIN diode is located between said at least one portion of the lower face of the anode region RAN and said at least one portion of the lower face of the cathode region RCAT and comprises the rest of the lower face FI of the PIN diode.

The second isolating region RIS2 comprises a shallow isolating trench extending under the second zone FIZ2 of the lower face of the PIN diode.

The first isolating region RIS1 comprises two isolating layers, for example dielectric layers of the gate oxide type, located respectively on either side of the shallow isolating trench RIS2.

The CELL includes a third contact CT3 contacting the siliconized zone ZS covering the overdoped zone ZSP within the substrate region SB and another third contact CT3 contacting the siliconized zone ZS covering the overdoped zone ZSN also within the substrate region SB.

In this embodiment, the high breakdown voltage HV can be applied: a) only between the first contact CT1 and the third contact CT3, b) only between the second contact CT2 and the other third contact CT3, c) both between the first contact CT1 and the third contact CT3 and between the second contact CT2 and the other third contact CT3 and either successively or simultaneously.

Case c) helps to better differentiate the two logic states of the memory cell corresponding to the "broken down" and "non-broken down" states of the first isolating region RIS1.

The read voltage RV is always applied between the first contact CT1 and the second contact CT2.

The invention claimed is:

1. An integrated memory device, comprising:

a one-time programmable memory cell including a first semiconductor bar having a lower face and an upper face opposite the lower face, a first electrically isolating region located between a first zone of the lower face and a semiconductor region, and a second electrically isolating region thicker than the first electrically isolating region located between a second zone of the lower face and said semiconductor region;

wherein the one-time programmable memory cell has a first logic state in the presence of a non-electrically broken down first electrically isolating region and a second logic state in the presence of an electrically broken down first electrically isolating region;

a first circuit configured to apply a breakdown potential difference between the semiconductor region and the first semiconductor bar so as to break down the first electrically isolating region; and a second circuit configured to apply a read voltage between two locations of the upper face of the first semiconductor bar and determine a value of a current flowing between the two locations so as to determine the first or second logic state of the one-time programmable memory cell.

2. The device according to claim 1, wherein the one-time programmable memory cell includes a first electrically conductive contact, a second electrically conductive contact and a third electrically conductive contact, the first circuit being configured to apply the breakdown potential difference between the third electrically conductive contact and one of the first and second electrically conductive contacts, and the second circuit being configured to apply the read voltage and determine the value of said current flowing between the first electrically conductive contact and the second electrically conductive contact.

3. The device according to claim 1, wherein the first semiconductor bar comprises a PIN diode including an intrinsic polysilicon region between an anode region and a cathode region, the first zone of the lower face of the PIN diode including at least one portion of the lower face of the intrinsic polysilicon region, or of the anode region or of the cathode region, wherein the first circuit is configured to apply the breakdown potential difference between the semiconductor region and the anode region or the cathode region, and wherein the second circuit is configured to apply the read voltage between a location of the upper face of the first semiconductor bar at the anode region and a location of the upper face of the first semiconductor bar at the cathode region.

4. The device according to claim 3, wherein the semiconductor region comprises a substrate semiconductor region, the first zone of the lower face of the PIN diode includes at least a portion of the lower face of the anode region and the second zone of the lower face of the PIN diode is located next to the first zone and comprises the rest of the lower face of the PIN diode, the first electrically isolating region comprises an isolating layer, and the second electrically isolating region comprises a shallow isolating trench extending adjacent to said isolating layer under the second zone of the lower face of the PIN diode.

5. The device according to claim 4, wherein the substrate semiconductor region has a conductivity type opposite the conductivity type of the anode region.

6. The device according to claim 3, wherein the semiconductor region comprises a substrate semiconductor region, the first zone of the lower face of the PIN diode includes at least a portion of the lower face of the cathode region and the second zone of the lower face of the PIN diode is located adjacent to the first zone and comprises the rest of the lower face of the PIN diode, the first electrically isolating region comprises an isolating layer, and the second electrically isolating region comprises a shallow isolating trench extending adjacent to the isolating layer under the second zone of the lower face of the PIN diode.

7. The device according to claim 6, wherein the substrate semiconductor region has a conductivity type opposite the conductivity type of the anode region.

8. The device according to claim 3, wherein the semiconductor region comprises a substrate semiconductor region, the first zone of the lower face of the PIN diode includes at least a portion of the lower face of the anode region and at least a portion of the lower face of the cathode region, and the second zone of the lower face of the PIN diode is located between said at least one portion of the lower face of the anode region and said at least one portion of the lower face of the cathode region and comprises the rest of the lower face of the PIN diode, the second electrically isolating region comprises a shallow isolating trench extending under the second zone of the lower face of the PIN diode and the first electrically isolating region comprises two isolating layers located respectively on either side of the shallow isolating trench.

9. The device according to claim 8, wherein the substrate semiconductor region has a conductivity type opposite the conductivity type of the anode region.

10. The device according to claim 3, wherein the semiconductor region comprises a second semiconductor bar located between the lower face of the PIN diode and a third electrically isolating region, the first zone of the lower face of the PIN diode includes at least a portion of the lower face of the intrinsic polysilicon region and the second zone of the lower face of the PIN diode is located on either side of the first zone, the first electrically isolating region includes a first isolating layer and the second electrically isolating region includes a second isolating layer thicker than the first isolating layer.

11. The device according to claim 10, wherein the third electrically isolating region includes a shallow isolating trench.

12. The device according to claim 10, wherein the second semiconductor bar has a conductivity type opposite that of the anode region.

13. The device according to claim 3, wherein the first zone of the lower face of the PIN diode includes at least a portion of the lower face of the intrinsic polysilicon region and the second zone of the lower face of the PIN diode is located on either side of the first zone, the first electrically isolating region includes a first isolating layer and the second electrically isolating region includes a second isolating layer thicker than the first isolating layer, the semiconductor region includes a semiconductor trench contacting the first isolating layer and extending through a fourth electrically isolating region.

14. The device according to claim 13, wherein the fourth electrically isolating region includes a shallow trench.

15. The device according to claim 13, wherein the semiconductor trench has a conductivity type opposite the conductivity type of the anode region.

16. The device according to claim 1, wherein the first semiconductor bar has a single conductivity type.

17. The device according to claim 16, wherein the single conductivity type of the first semiconductor bar is opposite the conductivity type of the semiconductor region.

18. A method for managing the logic state of a one-time programmable memory cell, the one-time programmable memory cell including a first semiconductor bar having a lower face and an upper face opposite the lower face, a first electrically isolating region located between a first zone of the lower face and a semiconductor region, a second electrically isolating region thicker than the first electrically isolating region located between a second zone of the lower face and said semiconductor region, the first semiconductor bar comprising a PIN diode including an intrinsic polysilicon region between an anode region and a cathode region, the first zone of the lower face including at least a portion of the lower face of the intrinsic polysilicon region, or of the anode region and/or of the cathode region, the method comprising:

- wherein the one-time programmable memory cell has a first logic state in the presence of a non-electrically broken down first electrically isolating region;
- wherein the one-time programmable memory cell has a second logic state in the presence of an electrically broken down first electrically isolating region; and
- breaking down the first electrically isolating region by applying a breakdown potential difference between the semiconductor region and the first semiconductor bar, the breakdown potential difference is applied between the semiconductor region and the anode region or the cathode region; and
- applying a read voltage between a location of the upper face of the first semiconductor bar at the anode region and a location of the upper face of the first semiconductor bar at the cathode region.

19. A method for managing the logic state of a one-time programmable memory cell, the one-time programmable memory cell including a first semiconductor bar having a lower face and an upper face opposite the lower face, a first electrically isolating region located between a first zone of the lower face and a semiconductor region, a second electrically isolating region thicker than the first electrically isolating region located between a second zone of the lower face and said semiconductor region, the method comprising:

wherein the one-time programmable memory cell has a first logic state in the presence of a non-electrically broken down first electrically isolating region;

wherein the one-time programmable memory cell has a second logic state in the presence of an electrically broken down first electrically isolating region; and determining the first or second logic state of the memory cell by applying a read voltage between two locations of the upper face of the first semiconductor bar and determining a value of a current flowing between the two locations.

20. The method according to claim 19, wherein the first semiconductor bar comprises a PIN diode including an intrinsic polysilicon region between an anode region and a cathode region, the first zone of the lower face of the PIN diode including at least a portion of the lower face of the intrinsic polysilicon region, or of the anode region and/or of the cathode region, the breakdown potential difference is applied between the semiconductor region and the anode region or the cathode region, and the read voltage is applied between a location of the upper face of the first semiconductor bar at the anode region and a location of the upper face of the first semiconductor bar at the cathode region.

* * * * *